(12) United States Patent
Michii

(10) Patent No.: US 6,323,545 B1
(45) Date of Patent: Nov. 27, 2001

(54) SEMICONDUCTOR DEVICE

(75) Inventor: Kazunari Michii, Tokyo (JP)

(73) Assignee: Mitsubishi DenkiKabushiki Kaisha, Tokyo (JP)

( * ) Notice: Subject to any disclaimer, the term of this patent is extended or adjusted under 35 U.S.C. 154(b) by 0 days.

(21) Appl. No.: 09/508,812

(22) PCT Filed: Oct. 7, 1997

(86) PCT No.: PCT/JP97/03569

§ 371 Date: Mar. 17, 2000

§ 102(e) Date: Mar. 17, 2000

(87) PCT Pub. No.: WO99/18610

PCT Pub. Date: Apr. 15, 1999

(51) Int. Cl.⁷ .......................... H01L 23/02; H01L 23/495
(52) U.S. Cl. .................. 257/678; 257/666; 257/787; 257/694; 257/696; 257/690; 257/692
(58) Field of Search .................... 257/678, 666, 257/787, 694–696, 690, 692; 438/123; 361/813

(56) References Cited

U.S. PATENT DOCUMENTS

| 5,105,261 | * | 4/1992 | Ueda et al. | 257/692 |
| 5,172,214 | | 12/1992 | Casto | 257/676 |
| 5,446,317 | * | 8/1995 | Sato et al. | 257/666 |
| 5,589,420 | * | 12/1996 | Russell | 438/123 |
| 5,623,395 | * | 4/1997 | Derouichi et al. | 361/735 |
| 5,760,471 | * | 6/1998 | Fujisawa et al. | 257/692 |

FOREIGN PATENT DOCUMENTS

| 54-87474 | | 7/1979 | (JP) . | |
| 62-149848 | | 9/1987 | (JP) . | |
| 62-261164 | | 11/1987 | (JP) . | |
| 4-196348 | | 7/1992 | (JP) . | |
| 5-206315 | | 8/1993 | (JP) . | |
| 6-97349 | | 4/1994 | (JP) . | |
| 7-22567 | | 1/1995 | (JP) . | |
| 7-30046 | | 1/1995 | (JP) . | |
| 63-52455 | * | 3/1988 | (JP) | 257/692 |
| 4-243155 | * | 8/1992 | (JP) | 257/692 |

* cited by examiner

Primary Examiner—Jhihan B Clark
(74) Attorney, Agent, or Firm—Leydig, Voit & Mayer, Ltd.

(57) ABSTRACT

A semiconductor element has electrodes on its periphery, leads for making external connections respectively in correspondence with the electrodes and connected to the electrodes through wires, and a package body in which a semiconductor element and leads are encapsulated with a resin material. The leads extend toward the bottom side of the package body for insertion into a socket and are bent alternately in a raised shape and a recessed shape, with the tops of the raised parts and the bottoms of the recessed parts exposed at side surfaces of the package body. The parts serving as the external connection electrodes (i.e., the tops of the raised parts and the bottoms of the recessed parts) are arranged at a large pitch, so that the area of the external connection electrodes can be enlarged to enhance the reliability of the contact.

4 Claims, 5 Drawing Sheets

SEMICONDUCTOR DEVICE

TECHNICAL FIELD

The present invention relates to the structure of a resin-encapsulated semiconductor device.

BACKGROUND ART

FIG. 7 is a perspective view showing the structure of a memory module used for memory expansion in a personal computer etc.

In the drawing, the reference character 17 denotes a module substrate, 18 denotes electrodes, and 19 denotes semiconductor devices for use as memory.

When expanding memory in a personal computer, the memory module shown in FIG. 7 is inserted in a memory expansion socket attached to the personal computer.

In the memory module, as shown in FIG. 7, a plurality of semiconductor memory devices are mounted on the module substrate 17 and the electrodes 18 for making external connections are arranged along the edge of the memory module substrate 17.

The electrodes 18 are inserted in a memory expansion socket in the body of the personal computer to make contact with the contact pins in the memory expansion socket, thus making electric connection.

However, with the recent increase in memory capacity of the semiconductor memory devices, it is not always necessary to pack a plurality of semiconductor memory devices 19 in the memory module as shown in FIG. 7.

For the packaging, low-price resin-encapsulation packages are used for the semiconductor memory devices 19.

Typical packages include the TSOP (Tin Small Outline Package) shown in FIG. 8 and SOJ (Small Outline Jleaded Package) shown in FIG. 9, for example.

These packages have gull-wing-like or J-shaped external leads 20 extending along the outer sides of the body so that they can be mounted with solder on a mounting substrate (the module substrate 17, for example).

These packages have the leads extending on the outside of the package body; when the electrodes 18 of the module substrate on which semiconductor memory devices using these packages are mounted as shown in FIG. 7 are inserted in a socket in a personal computer, the external leads 20 may be deformed unless handled carefully enough.

However, since expansion memories for personal computers etc. are for use by common users, they must be so constructed that they can be attached easily without suffering deformation of the external leads even if they are handled somewhat roughly, but the conventional package structures as shown in FIG. 8 and FIG. 9 do not satisfy this requirement sufficiently.

For semiconductor device packaging suitable for insertion into sockets, there is the LCC (Leadless Chip Carrier) which has a body made of ceramic, and which makes external connections by means of metal printed as terminals on sides of the body, but it requires extremely high packaging cost.

SUMMARY OF THE INVENTION

The present invention has been made to solve these problems, and an object of the invention is to provide a low-cost resin-encapsulated semiconductor device which can be easily inserted into a socket in the body of a personal computer etc. without suffering deformation of the external connections and which can surely make contact with contactors in the socket.

Another object is to enable size reduction of the resin-encapsulated semiconductor device above.

DISCLOSURE OF THE INVENTION

Semiconductor element having a plurality of electrodes formed in its periphery; a plurality of leads for external connection which are provided in correspondence with the plurality of electrodes and respectively connected to the plurality of electrodes through wires; and a package body in which the semiconductor element and the plurality of leads are encapsulated with a resin material, wherein the plurality of leads extend toward a bottom of the package body on the side to be inserted in a socket and bent alternately in raised shape and recessed shape, with tops of the raised parts and bottoms of the recessed parts exposed in surfaces of the package body, and therefore the parts serving as the external connection electrodes (i.e. the tops of the raised parts and the bottoms of the recessed parts) are arranged at a large pitch, so that the area of the external connection electrodes can be enlarged to enhance the reliability of the contact.

Alternatively, the external connection electrodes 2 can ensure required area even with a small lead pitch, and reducing the lead pitch enables the package to be downsized.

According to a semiconductor device of the invention, the plurality of leads extend toward the bottom of the package body on the side to be inserted in the socket and bent alternately in raised shape and recessed shape, with the tops of the raised parts and the bottoms of the recessed parts exposed in the surfaces of the package body, and the plurality of leads terminate in the vicinity of the middle of the bottom of the package body, and therefore the package body can be easily manufactured with a die through resin molding using an injection molding.

According to a semiconductor device of the invention, the semiconductor element mounted has the plurality of electrodes formed approximately in the middle of its surface, and the plurality of leads provided in correspondence with the plurality of electrodes of the semiconductor element have their respective ends on one side extended to the vicinity of the plurality of electrodes and connected to the corresponding electrodes through the wires, and therefore it is possible to reduce the dimension in the height direction of the entirety of the packaged semiconductor device to reduce the size of the semiconductor device.

BEST MODE FOR CARRYING OUT THE INVENTION

The present invention will now be described in detail referring to the accompanying drawings.

First Embodiment

Figure 1A:
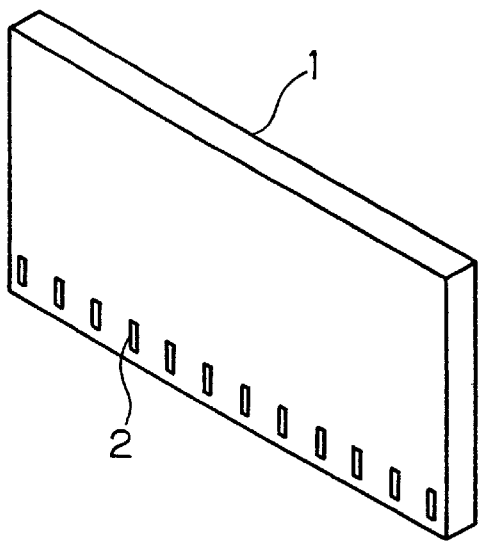
FIGS. 1A and 1B are perspective views showing the appearance of a semiconductor device according to a first embodiment of the invention.
Figure 1B:
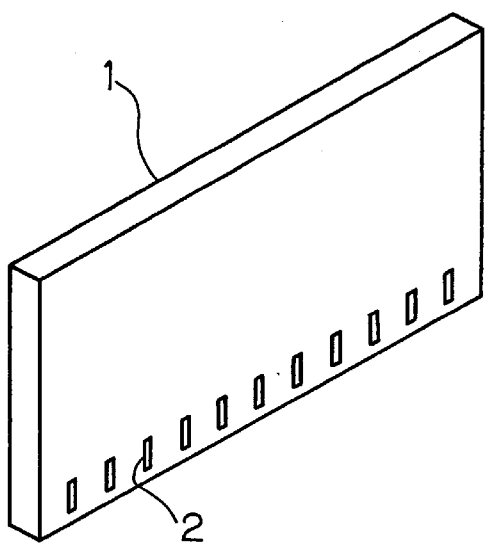

FIGS. 1A and 1B are perspective views showing the appearance of a semiconductor device according to a first embodiment of the invention, where FIG. 1A shows its front side and FIG. 1B shows its back side. In the drawing, the reference character 1 denotes the body of the package and 2 denotes electrodes for making external connections.

Figure 2:
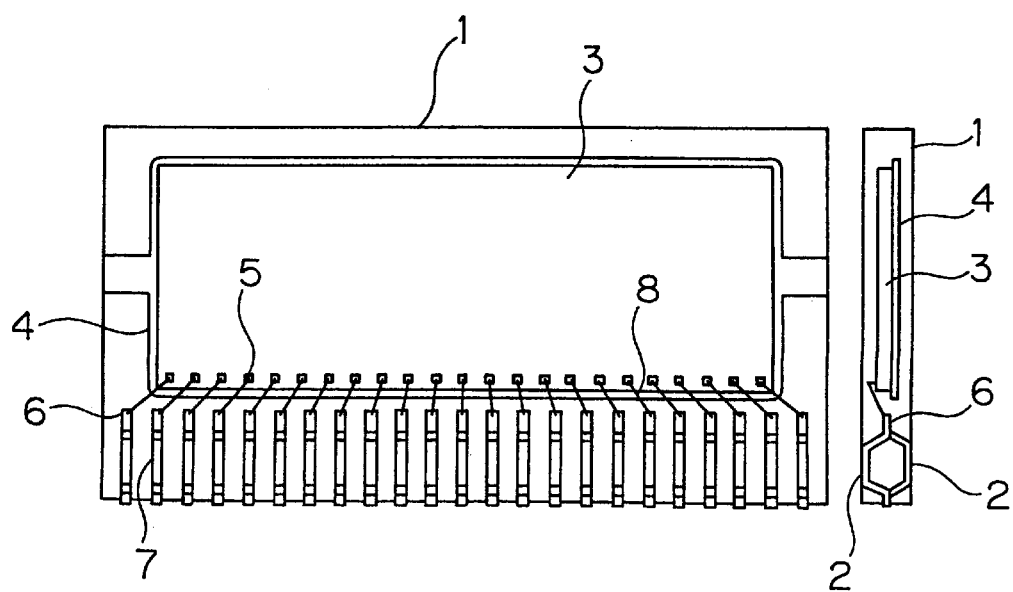
FIG. 2 is an opened-up plane view and a sectional view of the semiconductor device of the first embodiment of the invention.

FIG. 2 shows an opened-up plane view and a sectional view of the semiconductor device of the first embodiment of the invention, where the reference character 1 denotes the body of the package made of epoxy resin, for example, 2 denotes the electrodes for making external connections, 3 denotes a semiconductor element, 4 denotes a die pad on which the semiconductor element 3 is mounted, 5 denotes internal electrodes serving as electrodes of the semiconductor element 3, and 6 denotes leads arranged along the bottom edge of the package body 1 respectively in correspondence with the internal electrodes 5 of the semiconductor element 3.

These leads 6 are respectively connected to the corresponding internal electrodes 5 of the semiconductor element 3 through wires 8.

Figure 3:
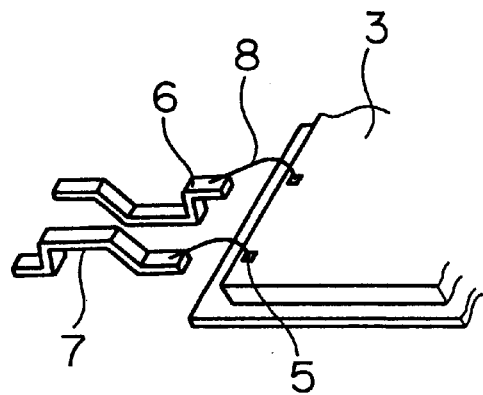
FIG. 3 is an exploded view showing a main part in the semiconductor device of the first embodiment of the invention, which shows the connection between electrodes of the semiconductor element (internal electrodes) mounted on a die pad and the leads.

The reference character 7 denotes bent parts of the leads 6; as shown in FIG. 3, the leads 6 are bent inside the package body in alternately recessed and raised shapes.

The bottoms of the recessed parts and the tops of the raised parts of the bends 7 of the leads 6 are exposed in the surfaces of the package body 1, which form the external connection electrodes 2 shown in FIGS. 1A and 1B.

Since the ends of the leads 6 away from the connections with the wires 8 are cut in the vicinity of the bottom of the package body 1 so that they do not project from the package body 1, the structure is substantially leadless to the outside.

Further, the leads 6 are shaped so that the ends of the leads 6 away from the connection with the wires 8 are located approximately in the middle of the bottom of the package body 1.

Figure 4:
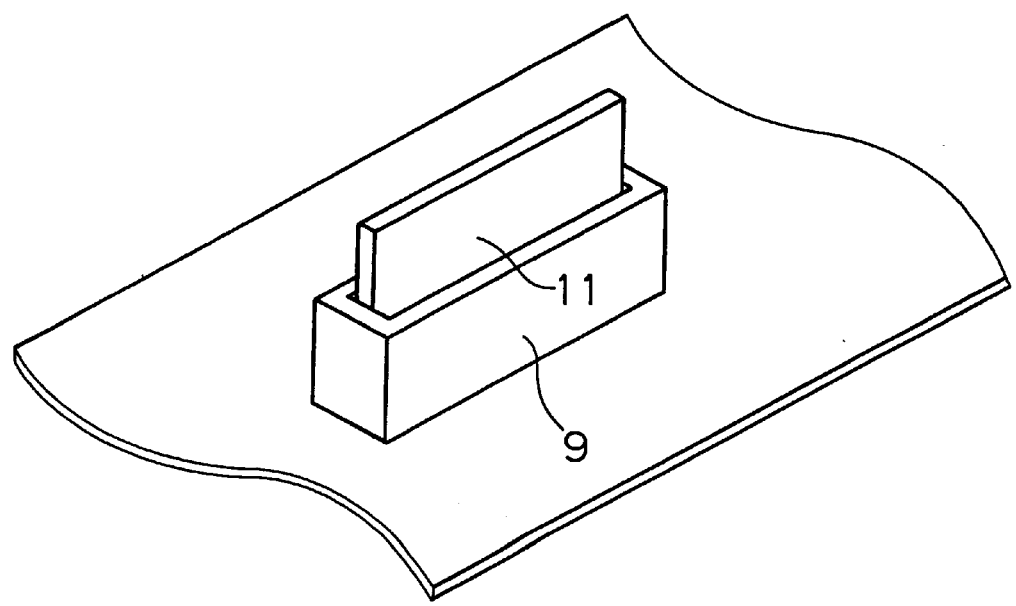
FIG. 4 is a perspective view showing the semiconductor device of the first embodiment of the invention fitted in a socket.
Figure 5:
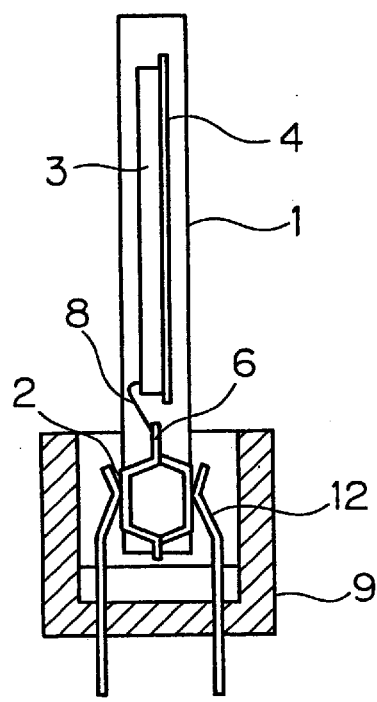
FIG. 5 is a sectional view showing the semiconductor device fitted in a socket in the first embodiment of the invention.

FIGS. 4 and 5 are a perspective view and a sectional view showing the semiconductor device of the first embodiment of the invention, which is mounted in a socket in the body of a personal computer or the like, where, in FIG. 4, 9 denotes the socket and 11 denotes the semiconductor device of the first embodiment, and in FIG. 5, 1 denotes the package body, 2 denotes the external connection electrodes, 3 denotes the semiconductor element, 4 denotes the die pad, 6 denotes the leads, 8 denotes the wires, 9 denotes the socket, and 12 denotes the contact pins in the socket 9.

As shown in FIGS. 4 and 5, when the semiconductor device 11 of the first embodiment is inserted in the socket 9 in the body of a personal computer, for example, the contact pins 12 can, through spring action, surely come in contact with and electrically connect to the external connection electrodes 2 formed of the leads 6 that are bent alternately in raised and recessed shapes and exposed in the surfaces of the package body 1.

Since the external connection electrodes 2 formed on the leads 6 are alternately exposed near the bottom on both sides of the package body 1 (i.e., on the front and back surfaces shown in FIGS. 1A and 1B, the pitch between the external connection electrodes 2 on each surface is twice that between the leads 6.

Accordingly, though not shown, each lead 6 can be formed sufficiently wider in the part serving as the external connection electrode 2 than in both ends of the lead 6 so that they can come in contact with the contact pins 12 in the socket 9 in larger area, which enhances the reliability of the contact.

As described above, according to the semiconductor device of the first embodiment, unlike conventional ones, even a common user unaccustomed to the operation can easily insert the semiconductor device into a socket in the body of a personal computer etc. without a fear of deformation of the leads 6, since the leads 6 do not project outside of the package body 1.

Furthermore, the lead pitch between the parts serving as the external connection electrodes 2 is large since the leads 6 are alternately bent in recessed and raised shapes in the package body 1 and the bottoms of the recessed parts and the tops of the raised parts of the bends 7 serving as the external connection electrodes 2 are exposed on both sides of the package body 1, so that the area of the external connection electrodes 2 can be made larger to enhance the reliability of the contact.

Alternatively, the external connection electrodes 2 can ensure required area even with a small lead pitch, and reducing the lead pitch enables size reduction of the package.

Furthermore, the leads 6 are shaped so that the ends of the leads 6 to which the wires 8 are not connected are located approximately in the middle of the bottom of the package body 1 and they extend on the same plane outside the package body 1 before encapsulated with resin, so that a resin molding die can easily pinch and hold this part and the package body 1 can be easily manufactured with the die through resin molding using injection molding.

After the process of encapsulating the package body 1 with resin, the ends of the leads 6 which project out of the package body 1 are cut off.

Second Embodiment

Figure 6:
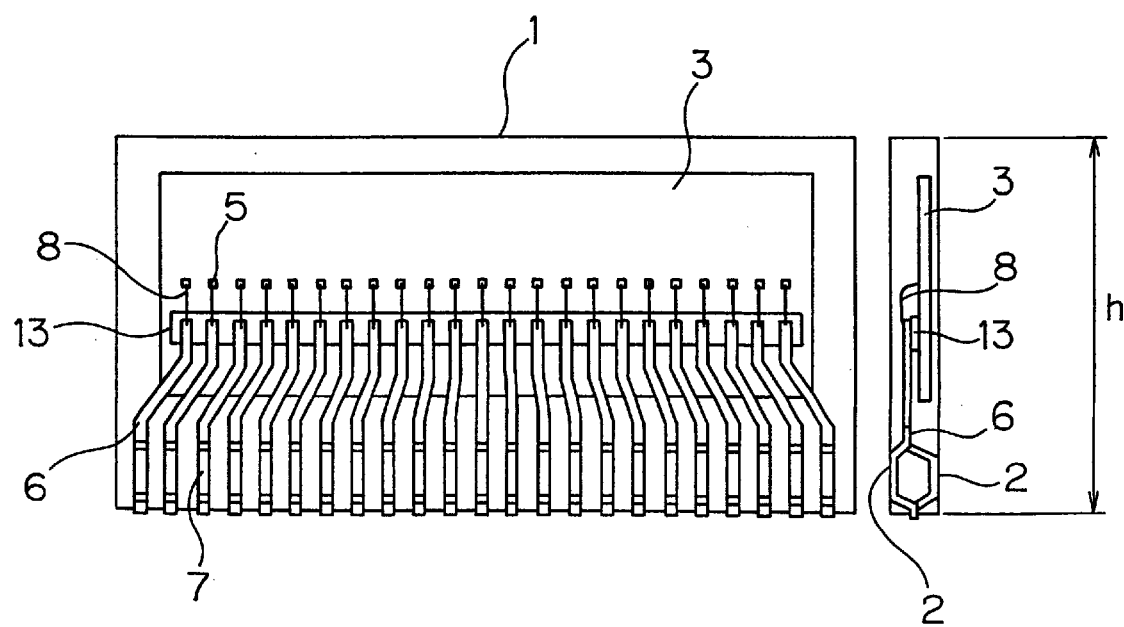
FIG. 6 is an opened-up plane view and a sectional view showing a semiconductor device according to a second embodiment of the invention.
Figure 7:
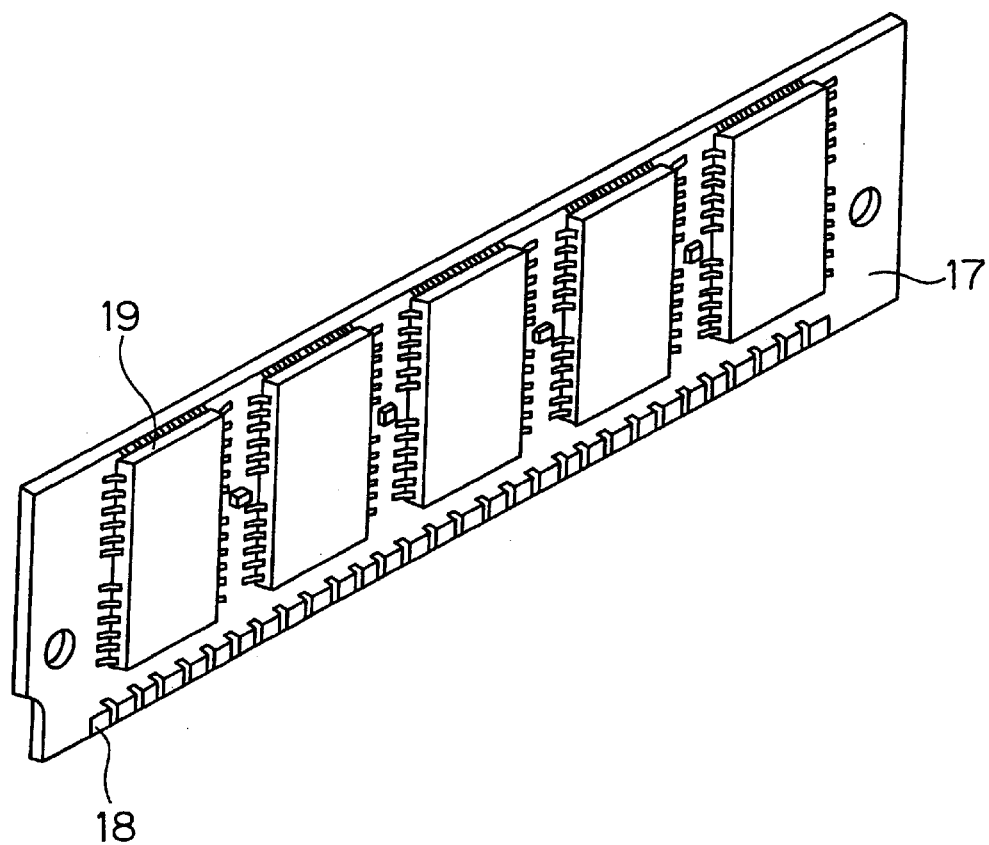
FIG. 7 is a perspective view showing the appearance of a conventional memory module.
Figure 8:
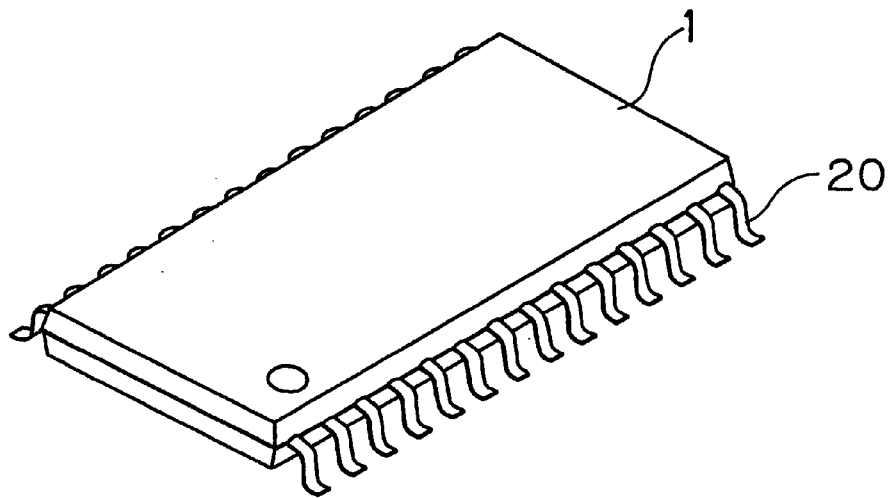
FIG. 8 is a perspective view showing the appearance of a conventional TSOP type semiconductor device.
Figure 9:
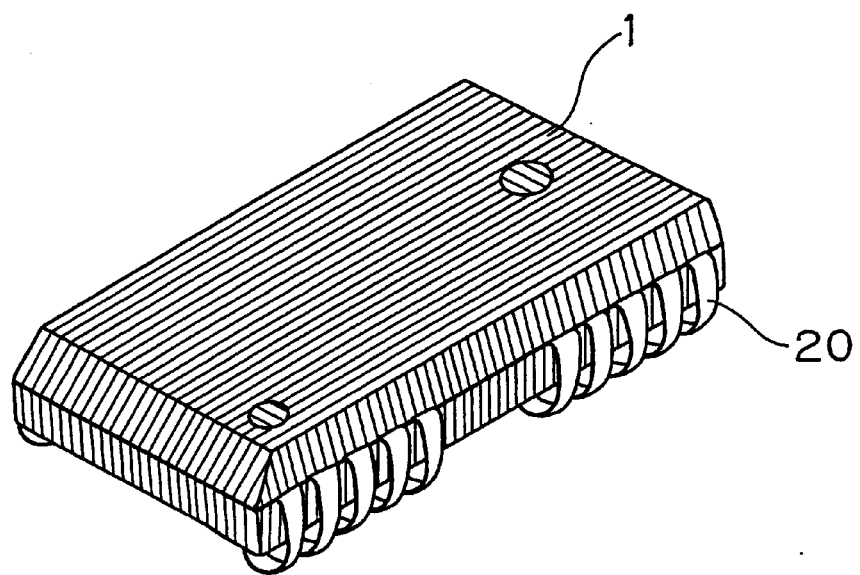
FIG. 9 is a perspective view showing the appearance of a conventional SOJ type semiconductor device.

FIG. 6 shows an opened-up plane view and a sectional view of a semiconductor device according to a second embodiment of the invention, where the reference character 1 denotes the body of a package made of epoxy resin, for example, 2 denotes external connection electrodes, 3 denotes a semiconductor element, 5 denotes internal electrodes as electrodes of the semiconductor element 3, and 6 denotes leads arranged along the bottom side of the package body 1 respectively in correspondence with the internal electrodes 5 of the semiconductor element 3.

These leads 6 are each connected to a corresponding one of the internal electrodes 5 of the semiconductor element 3 through the wire 8.

The reference character 7 denotes bent parts of the leads 6; the leads 6 are bent in alternating recessed and raised shapes in the package body 1 like those shown in FIG. 3 in the first embodiment.

The bottoms of the recessed parts and the tops of the raised parts of the bends 7 of the leads 6 are exposed on the surfaces of the package body 1, and the exposed parts serve as the external connection electrodes 2 like those shown in FIG. 3.

The ends of the leads 6, on the opposite side to the connections with the wires 8, are cut off in the vicinity of the bottom of the package body so that they do not project from the package body, and therefore the structure is substantially leadless to the outside.

The structure of the second embodiment is characterized in that the internal electrodes 5 of the semiconductor element 3 are arranged in or near the middle of the semiconductor element 3 and that the ends of the leads 6 on the side of the internal electrodes 5 of the semiconductor element 3 are extended to the vicinity of the internal electrode 5 through an insulating member 13, and the internal electrodes 5 and the corresponding leads 6 are connected by wire bonding through the wires 8.

Adopting this structure enables reduction of the dimension "h" in the height direction of the entirety of the packaged semiconductor device, thus enabling size reduction of the semiconductor device.

INDUSTRIAL APPLICABILITY

As described above, even a common user unaccustomed to the attaching operation, such as inserting of an expansion memory device in a socked in a personal computer, can easily and certainly attach the semiconductor device of the invention in the socket and the semiconductor device is suited for manufacture of semiconductor devices with reduced size and low cost.

What is claimed is:

1. A leadless package packaged semiconductor device comprising:

a semiconductor element including a plurality of electrodes on a first surface of the semiconductor element;

a plurality of leads spaced from and disposed along one side of the semiconductor element;

a plurality of wires electrically connecting corresponding electrodes and leads; and a resin completely encapsulating the semiconductor element and the plurality of wires, having two generally planar opposed surfaces, and completely encapsulating the plurality of leads except for an exposed portion of each lead that is exposed at and flush with one of the opposed surfaces, the exposed portions of the leads providing electrical access to the semiconductor element and being located proximate a bottom surface of the resin encapsulation on the opposed surfaces of the resin encapsulation.

2. The leadless package packaged semiconductor device of claim 1 wherein alternating leads are exposed on respective opposed surfaces of the resin encapsulation.

3. A leadless package packaged semiconductor device comprising:

a semiconductor element including a plurality of electrodes on a first surface of the semiconductor element;

an insulating member disposed on the first surface of the semiconductor element;

a plurality of leads disposed along one side of the semiconductor element, extending to and contacting the insulating member;

a plurality of wires electrically connecting corresponding electrodes and leads; and a resin completely encapsulating the semiconductor element and the plurality of wires, having two generally planar opposed surfaces, and completely encapsulating the plurality of leads except for an exposed portion of each lead that is exposed at and flush with one of the opposed surfaces, the exposed portions of the leads providing electrical access to the semiconductor element and being located proximate a bottom surface of the resin encapsulation on the opposed surfaces of the resin encapsulation.

4. The leadless package packaged semiconductor device of claim 3 wherein alternating leads are exposed on respective opposed surfaces of the resin encapsulation.

\* \* \* \* \*